United States Patent [19]
Hoffmann

[11] Patent Number: 4,742,489
[45] Date of Patent: May 3, 1988

[54] INTEGRATED SEMICONDUCTOR MEMORY

[75] Inventor: Kurt Hoffmann, Taufkirchen, Fed. Rep. of Germany

[73] Assignee: Siemens Aktiengesellschaft, Berlin and Munich, Fed. Rep. of Germany

[21] Appl. No.: 811,886

[22] Filed: Dec. 20, 1985

[30] Foreign Application Priority Data

Dec. 28, 1984 [DE] Fed. Rep. of Germany ....... 3447761

[51] Int. Cl.$^4$ .............................................. G11C 7/00
[52] U.S. Cl. ...................................... 365/201; 371/21
[58] Field of Search ................ 371/21, 25; 324/73 R; 365/201, 200

[56] References Cited

U.S. PATENT DOCUMENTS 4,541,090  9/1985  Shiragasawa ........................ 371/21

OTHER PUBLICATIONS

S. Eaton et al., "A 100ns 64K Dynamic RAM Using Redundancy Techniques", IEEE International Solid-State Circuits Conference—Digest of Technical Papers, Feb. 18, 1981, pp. 84–85.

P. Mattos et al., "Nibble-Mode Beschleunigt Speicherzugriff", Elektronik, No. 15, Jul. 30, 1982, pp. 27–30.

Primary Examiner—Joseph A. Popek
Attorney, Agent, or Firm—Herbert L. Lerner; Laurence A. Greenberg

[57] ABSTRACT

An integrated semiconductor memory includes n identical memory cell fields each having a data width equal to m, n·m data lines for writing-in and reading-out memory data into and out of the memory cell fields, m first data separators for applying the memory data as a function of addressing data when written-in, m second data separators for selecting one of the n data lines in response to the addressing data. It further has evaluation circuits connected to n of the n·m data lines parallel to the respective second data separators. It also has third data separators connected between each of the m data input terminals and the n of n·m data lines parallel to the first data separators for transferring the memory data in parallel to all of the n data lines in response to the control signal, and fourth data separators each preceding a respective one of the m data output terminals for selectively feeding the memory data selected by the second data separators or the output signal generated by the evaluation circuit to the data output terminals in response to the control signal and a complementary signal.

13 Claims, 6 Drawing Sheets

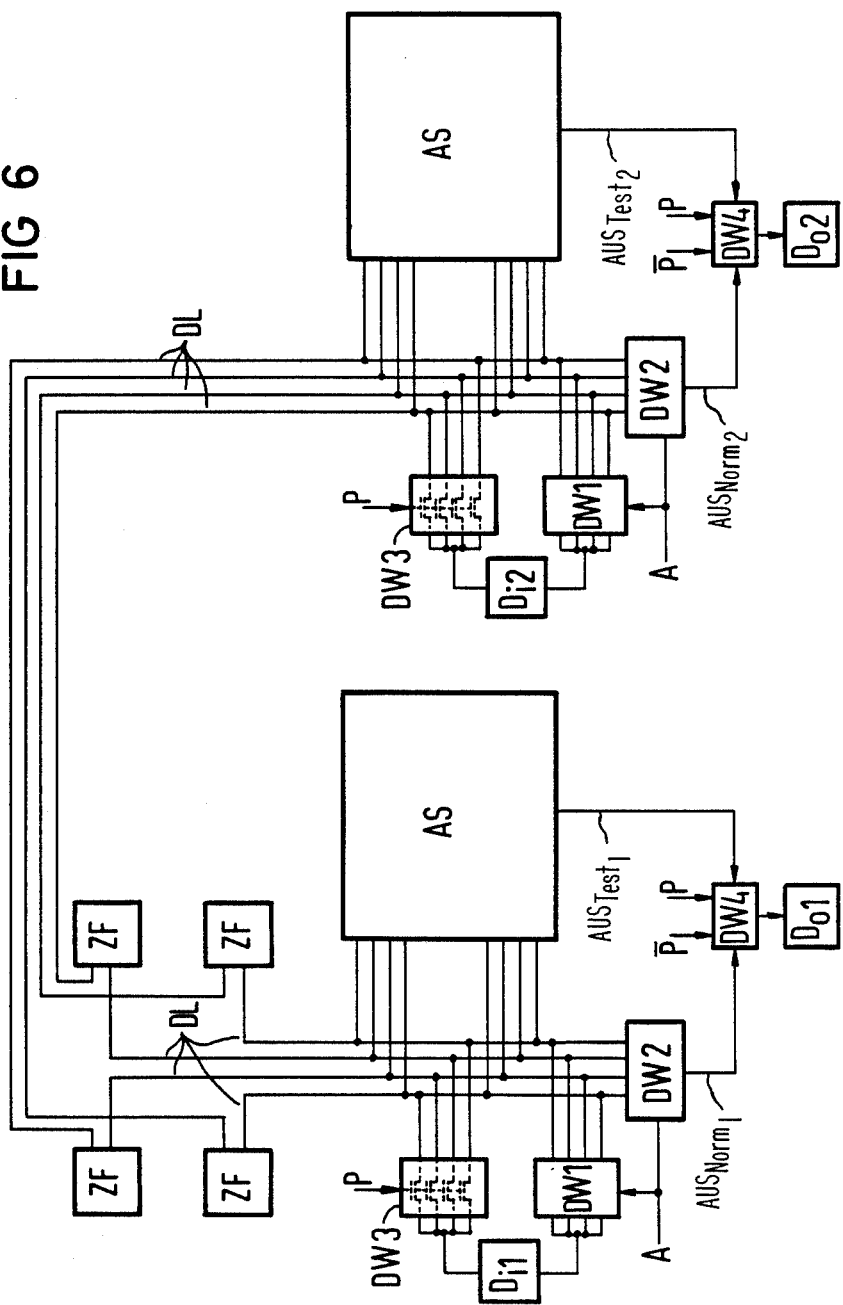

INTEGRATED SEMICONDUCTOR MEMORY

The invention relates to an integrated semiconductor memory with n identical storage cell fields, n·m data lines for writing-in and reading-out memory or storage data into and out of the memory cell fields, m first data separators each applying memory data to one of the n associated data lines when writing-in, the memory data being present at its assigned data input terminal to be written into the semiconductor memory as a function of addressing data, m second data separators each selecting one of the n data lines in dependence on addressing data when reading out memory data present at n respective data lines, and applying it through an output to a corresponding data output terminal.

Semiconductor memories of the above-mentioned type are known, for instance, from the publication IEEE International Solid-State Circuits Conference 1981, Pages 84 to 85 and from the publication Elektronik, No. 15, July 30, 1982, Pages 27 to 30. In semiconductor memories of this type, it is known to divide a total memory area for the user which has data interfaces 1 bit wide for data input and output, into n equal cell fields. For this purpose it is common to assign a data input line of its own to each cell field, internally to the memory, which are all connected to a data terminal through a first data separating circuit. During operation, the selection as to which of the n data lines is to be connected through to the data input terminal is made through the address input or a corresponding number of most significant address inputs. Similarly, the n data lines are connected to a data output terminal through a second data separator.

The value n is even-numbered. Furthermore, as is well known, it is equal to the number of desired cell fields and depends on whether simple address signals (i.e. only so-called X-addresses or Y-addresses) are applied or address signals which sequentially contain an X-address within a clock period of the semiconductor memory as well as a Y-address (address multiplex) at the address inputs, through which the semiconductor memory is addressed. In this case, n can only be a number divisible by 4.

Furthermore, semiconductor memories are also known which have data interfaces that are more than one bit wide for data inputs and outputs. Typical organization forms for this purpose are data interfaces with a width of m=4, 8 and 9 bits. Semiconductor memories constructed in this way contain more and more storage cells due to the progress in integration possibilities. However, the increase of storage cells per semiconductor memory necessitates increased costs in time, personnel and financing for the testing of semiconductor memories for the manufacturer as well as for the customer who in all probability performs a so-called "incoming inspection". Due to the special required structure of test patterns for testing, the time required for testing increases exponentially with an increase of storage cells. For this reason it is desirable for the testing time to be shortened significantly without having to decrease the efficiency of the test patterns being used. Although earlier attempts with integrated circuits, in which several semiconductor chips or modules were tested in parallel by an automatic tester, resulted in an excellent shortening of the testing time, the amount of mechanical means required for this purpose was very large (test prods on a wafer plane, measuring fixtures with cables on the module plane) In addition, existing testing programs had to be adapted in a complicated manner.

It is accordingly an object of the invention to provide an integrated semiconductor memory which overcomes the heretofore-mentioned disadvantages of the heretofore-known devices of this general type, and which makes it possible to shorten the testing time without the loss of efficiency of the test patterns being used.

With the foregoing and other objects in view there is provided, in accordance with the invention, an integrated semiconductor memory, comprising n identical memory cell fields, n·m data lines each being connected to a respective one of the memory cell fields for writing-in and reading-out storage or memory data into and out of the memory cell fields, m first data separators each being connected to the data lines and each having an assigned data input terminal for applying the memory data present at the assigned data input terminal to be written into one of the associated n data lines of the semiconductor memory as a function of addressing data when written-in, m second data separators each being connected to the data lines and each having an output for selecting one of the n data lines in dependence on the addressing data when reading out the memory data present at the n respective data lines and for applying the memory data to the outputs of the second data separators, data output terminals connected to the outputs of the second data separators for receiving the memory data, first terminal means for providing a control signal, second terminal means for providing a signal complementary to the control signal, evaluation circuits each having an output and each being connected always to n of the n·m data lines parallel to the respective second data separators for delivering output signals at the outputs of the evaluation circuits each output signal in the form of a first logical level if all n data lines connected to one of the evaluation circuits contain the same memory data (O.K. case) and for delivering output signals at the outputs of the evaluation circuits in the form of a second logical level if the n data lines connected to one of the evaluation circuits contain different memory data (fault case), third data separators connected to the first terminal means and connected between each of the m data input terminals and the associated n of n·m data lines parallel to the respective first data separators for transferring the memory data to be written into the semiconductor memory in parallel to all of the n data lines in dependence on the control signal, and fourth data separators each being connected to the first and second terminal means and each preceding one of the data output terminals or being connected between a respective one of the m data output terminals and the outputs of a respective one of the second data separators and of a respective one of the evaluation circuits for selectively feeding either the memory data selected by the second data separators or the output signal generated by the evaluation circuit to the data output terminals in dependence on the control signal and the complementary signal. The basic object of the invention is to construct a semiconductor memory in such a way that although it can be operated in a customary or normal manner it is possible in a test case to connect partial regions of the semiconductor memory in parallel, internal to the memory, and to permit the recognition within the memory in the test case, as to whether the parallel-connected partial regions have the same data content (O.K. case) or not (fault case).

In accordance with another feature of the invention, each of the evaluation circuits includes a valence function device having inputs forming connections of the evaluation circuits to the n data lines and an output forming the outputs of the evaluation circuits.

In accordance with an added feature of the invention, each of the evaluation circuits includes an anti-valence function device having inputs forming connections of the evaluation circuits to the n data lines and an output forming the outputs of the evaluation circuits.

In accordance with a further feature of the invention, each of the third data separators includes n transistors each being connected between an associated data input terminal and a respective one of the data lines for the data input terminal, and the transistors have gates connected in parallel to the first terminal means.

In accordance with yet another feature of the invention, each of the m fourth data separators each include first and second transistors having source, drain and gate terminals, the drain terminals of the first and second transistors being connected together to an associated data output terminal, the source terminal of the first transistor being connected to the output of an associated second data separator, the source terminal of the second transistor being connected to the output of an associated evaluation circuit, the gate terminal of the first transistor being connected to the second terminal means, and the gate terminal of the second transistor being connected to the first terminal means.

In accordance with yet an additional feature of the invention, the first terminal means is a separate terminal used exclusively for the control signal.

In accordance with yet an added feature of the invention, the first terminal means is a terminal which is also used for other signals from the semiconductor memory.

In accordance with yet a further feature of the invention, the first terminal means receives the most significant of the addressing signals during normal operation.

In accordance with still an additional feature of the invention, the control signal is at a higher potential than that which corresponds to a logical "1", for switching from normal operation to testing operation in which the evaluation circuits are used.

In accordance with still an added feature of the invention, the first terminal means includes a discriminator circuit for recognizing whether or not the higher potential is applied and for activating the control signal.

In accordance with a concomitant feature of the invention, the integrated semiconductor memory includes n identical memory cell fields, n·m data lines each being connected to a respective one of the memory cell fields for writing-in and reading-out memory data into and out of the memory cell fields, m first data separators each being connected to the data lines and each having an assigned data input terminal for applying the memory data present at the assigned data input terminal to be written into one of the n data lines of the semiconductor memory as a function of addressing data when written-in, m second data separators each being connected to the data lines and each having an output for selecting one of the n data lines in dependence on the addressing data when reading out the memory data present at the n data lines and for applying the memory data to the outputs of the second data separators, data output terminals connected to the outputs of the second data separators for receiving the memory data, terminal means for providing a control signal, evaluation circuits each having an output and each being connected to n of the n·m data lines parallel to the respective second data separators for delivering an output signal at the outputs of the evaluation circuits in the form of a first logical level if all n data lines connected to the evaluation circuits contain the same memory data (O.K. case) and for delivering an output signal at the outputs of the evaluation circuits in the form of a second logical level if the n data lines connected to the evaluation circuits contain different memory data (fault case), third data separators connected to the terminal means and connected between each of the m data input terminals and the n of n·m data lines parallel to the first data separators for transferring the memory data to be written into the semiconductor memory in parallel to all of the n data lines in dependence on the control signal, and other terminals each being connected to a respective one of the outputs of the evaluation circuits and being used exclusively therefor.

The invention can be applied, among other things, to DRAM's and SRAM's as well as to EPROM's and EEPROM's.

Other features which are considered as characteristic for the invention are set forth in the appended claims.

Although the invention is illustrated and described herein as embodied in an integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 2 is a diagram of a specific embodiment of an evaluation circuit AS;

FIG. 6 is a diagram of the first embodiment of the invention, applied to a memory with data interfaces with a width of 2 bits.

Figure 1:
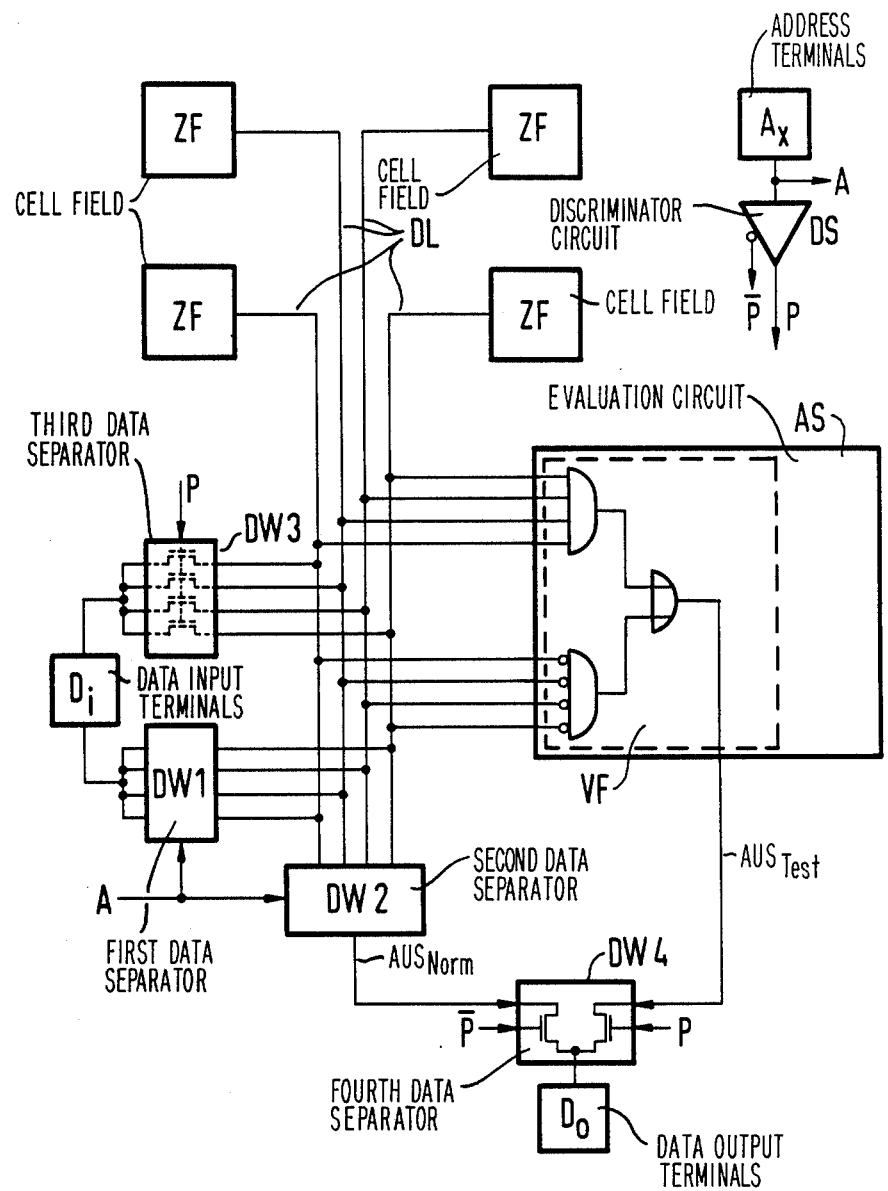
FIG. 1 is a block and schematic circuit diagram of a first embodiment of the invention.

Referring now to the figures of the drawings in detail and first, particularly, to FIG. 1 thereof, there is seen a semiconductor memory according to the invention with m=1 data input terminals $D_i$ and m=1 data output terminals $D_o$, that contains n=4 identical cell fields ZF (for instance, in a "megabit" memory, the total number of storage cells would be: 1024k.1 bit=1M.1 bit, which makes four cell fields ZF at 256k.1 bit, with n=4). One of n data lines DL is connected to each cell field ZF. These lines serve for writing information into the cell field ZF and for reading it out. In a known manner, these n=4 data lines DL are connected to the data input terminal $D_i$ through a first data separator DW1. In order to write information into the memory, the information present during normal operation at the data input terminal $D_i$ is connected to one of the n=4 existing data lines DL by addressing the first data separator DW1 by means of a given address information, namely an addressing signal A which is present at the most significant terminal $A_x$ of the existing address terminals; from there, it is written into the corresponding cell field ZF. Similarly, the data lines DL are connected to the data output terminal $D_o$ through a second data separator DW2. This data separator is driven exactly like the first data separator DW1, as far as the address is concerned.

The second data separator connects one of the n data lines DL to the data output terminal $D_o$. These parts of a semiconductor memory according to the invention described so far are already known by themselves. They are applied, for instance, in semiconductor memories which permit the so-called "nibble-mode" of operation.

The semiconductor memory according to the invention therefore advantageously contains a third data separator DW3 parallel to the first data separator DW1, by means of which information present in testing operation at the data input terminal $D_i$ is simultaneously transferred to all n=4 data lines DL. For instance, the third data separator DW3 can contain n=4 parallel-connected transistors, one side of the conduction paths thereof being connected together to the data input terminal $D_1$ and the other sides of the conduction paths thereof each being connected to one data line DL. The gates of the transistors of the third data separator DW3 are driven by a control signal P, the generation of which will be described below. If information is written into the cell fields ZF through this third data separator DW3, these cell fields ZF then contain the same information as each other.

If each of the cell fields ZF is considered during a testing operation as a memory of its own (test piece), the (test) information which must be adapted to a cell field ZF as far as the address is concerned, can simultaneously be written in parallel into all of the cell fields ZF.

Figure 3:
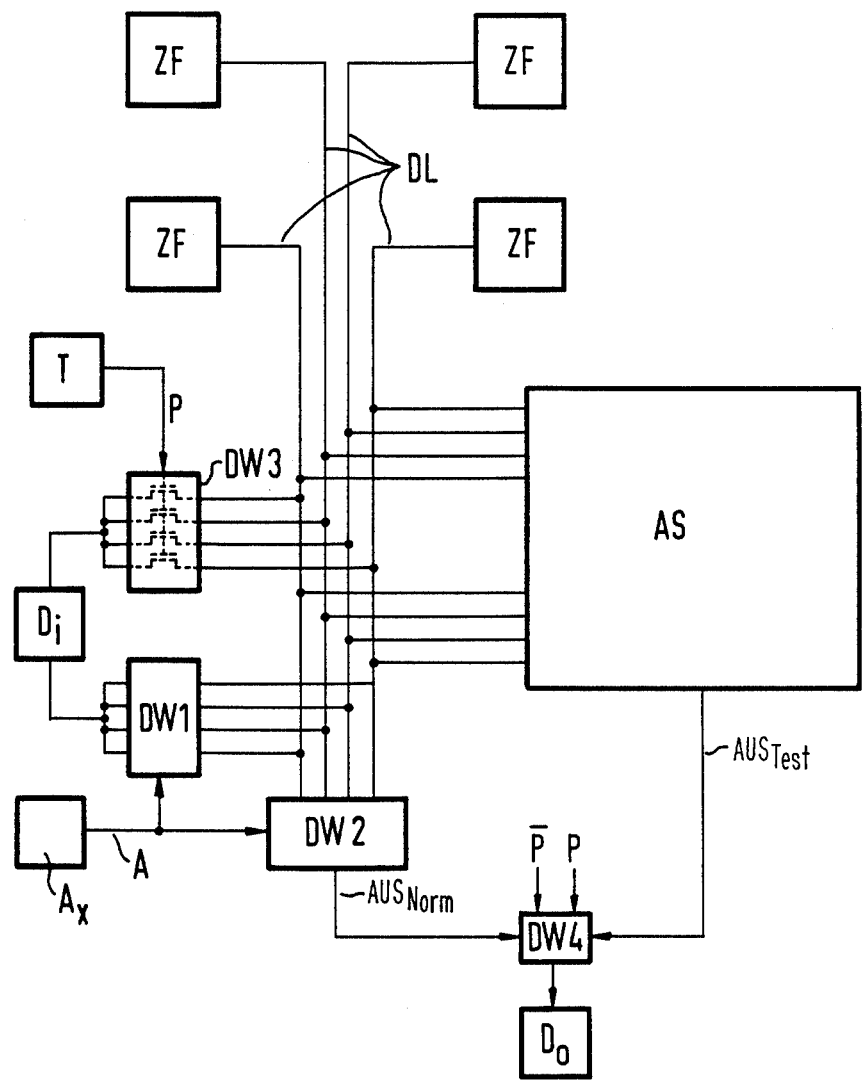
FIG. 3 is a block and schematic circuit diagram of a second embodiment of the invention.

The control signal P which activates the third data separator DW3, can be obtained in different ways. In an embodiment according to FIG. 3, a test signal in the form of a constant potential (for instance a logical '1') is applied when testing at a further terminal T. In normal operation, either a constant potential, such as with a value logical '0' is applied, or the terminal T remains unconnected The control signal P generated in this manner, can be taken off directly at the terminal T and then addresses the gates of the third data separator DW3 among other things, so that the transistors thereof conduct. On one hand, this construction has the advantage of permitting a potential value to be selected, which is also used otherwise for addressing the semiconductor memory (for instance "TTL-level"). On the other hand, however, an additional terminal is required for the terminal T which in some circumstances may not be available due to the dimensions of the case of the semiconductor memory.

In another embodiment, shown in FIG. 1, a terminal which is used concurrently is otherwise used for normal operation. The the most suitable terminal is an available terminal which serves for addressing the semiconductor memory with address information, especially information regarding the most significant X and Y or X/Y information (with the presently customary address multiplex method). In normal operation, for instance, a (most significant) address signal A is applied to such a terminal with a '0' level of 0 volts and a '1' level of 5 volts, with presently customary semiconductor memories. In the embodiment of the semiconductor memory according to FIG. 1, this terminal is generally designated with reference symbol $A_x$.

In the normal case, the terminal carries the most significant X/Y address information. In order to carry out the testing operation, a potential is applied which is, for instance, clearly above the '0' level of the customary address signal A present at the address terminal $A_x$, such as 10 V. A subsequent discriminator circuit DS recognizes this applied potential and generates the control signal P internally in the semiconductor memory. Discriminator circuits DS are known in the art, such as in the form of threshold value switches. Prior art threshold value switches can be seen, for instance, in German Published, Non-Prosecuted application Nos. DE-OS 30 30 852 and DE-OS 33 18 564. However, other embodiments according to the state of the art are also conceivable.

Furthermore, a semiconductor memory according to the invention also contains identical evaluation circuits AS (m=width of the data interfaces for data input and output).

It is the task of each of these evaluation circuits AS to take over information present on the n data lines DL assigned to the respective evaluation circuit AS when reading out from the semiconductor memory; to generate a signal at an output $AUS_{Test}$ which has a first logical level if all of these pieces of information are identical to each other (which corresponds to the "O.K." case on the basis of prior parallel storage in the cell fields ZF) and to pass the signal on to the data output terminal $D_o$, or to generate a fault signal with a second logical level which is complementary to the first logical level if the data are not equal to each other (fault case) and to pass the fault signal on to the data output terminal $D_o$, so that an automatic tester connected to the data output terminal $D_o$ can recognize it as an activated fault signal. Due to the binary logic used, this activated fault signal has the value logical '0' in the case of a fault, for instance (a reverse definition is, of course, conceivable).

In the testing case, an automatic tester only needs to recognize which of the two logical levels is present at the data output terminal $D_o$ so that a decision can be made as to "fault" or "O.K.". It should be emphasized that the signal present at the output of the evaluation circuit AS (and therefore the signal present at the data output terminal $D_o$) does no represent memory information read out from the semiconductor memory, but rather the result of the test already carried out in the evaluation circuit AS.

This type of testing is entirely sufficient for the usual production tests performed at the manufacturers location (on the wafer level, with and without redundant storage cells or at the modular level) as well as for incoming inspections performed at the customer's location. However, testing for purposes of analysis or similar purposes is not possible because of the addressing inaccuracy (to ascertain which cell field ZF is defective) which occurs in parallel testing within a semiconductor memory.

In addition, it is not necessary to be able to recognize the following fault case in which all storage cells addressed in the parallel-connected cell fields ZF at a given point in time are defective, i.e. they contain incorrect information. This error case is not recognized by the evaluation circuit AS. However, this is also not necessary, since in such a case, with which a worker is entirely familiar, the semiconductor memory is defective in a multiplicity of storage cells and there are also a few storage cells of a cell field ZF which are connected in parallel with good storage cells of other cell fields ZF during a test operation. The defective semiconductor memory is then recognized as such again.

This is entirely sufficient for simple "go/ no go" tests. The advantage of being able to use complex test patterns which are time-intensive in conventional tests with a distinctly shortened testing time, by far overshadows the disadvantage described.

One possible advantageous embodiment of the evaluation or selection circuit AS is contained in FIG. 1 and will be explained below.

The evaluation circuit AS contains a conventional valence function device VF with an AND-gate, a further AND-gate connected in such a way as to perform a NOR-function, and an OR-gate. The output signal $AUS_{Test}$ indicates the fault case by the level "logical 1'".

Figure 2:
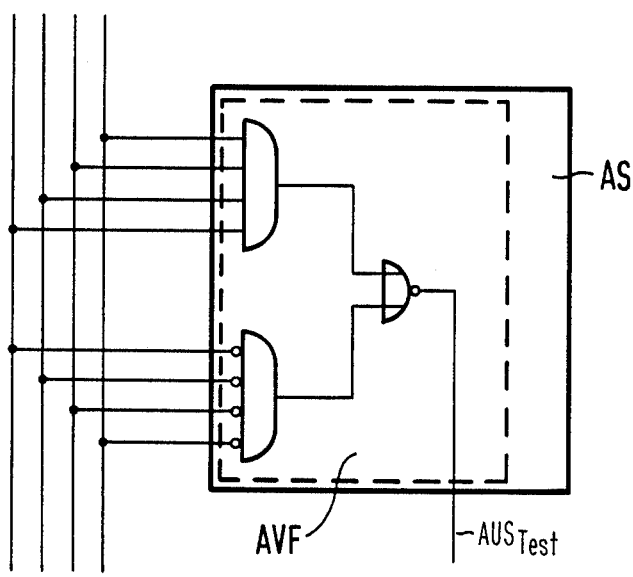

Another evaluation circuit AS is shown in FIG. 2. This device includes a conventional anti-valence function device AVF with an AND-gate, a further AND-gate connected in such a way as to perform a NOR-function and a NOR-gate. The output signal $AUS_{Test}$ indicates the fault case by the level "logical '0'".

The embodiment of the invention according to FIG. 1 furthermore advantageously includes a fourth data separator DW4 for each bit of width m of the interfaces, which serves for connecting the information $AUS_{Test}$ from the respective second data separator DW2 to the respective data output terminal $D_o$ during normal operation, and for connecting the output of the respective evaluation circuit AS to the corresponding terminal $D_o$ instead, during test operation. This purpose is served by two transistors for each fourth data separator DW4. The drain terminals of the transistors are connected together to the corresponding data output terminal $D_o$. The source terminal of the one transistor is connected to the output of the second data separator DW2, while the source terminal of the other transistor is connected to the output of the evaluation circuit AS. The transistor connected to the second data separator is driven gatewise by a signal P which is complementary to the control signal P; the other transistor is driven by the control signal P. It is therefore possible to selectably switch the output of the second data separator DW2 or the output of the evaluation circuit AS to the data output terminal $D_o$ selectably.

Figure 4:
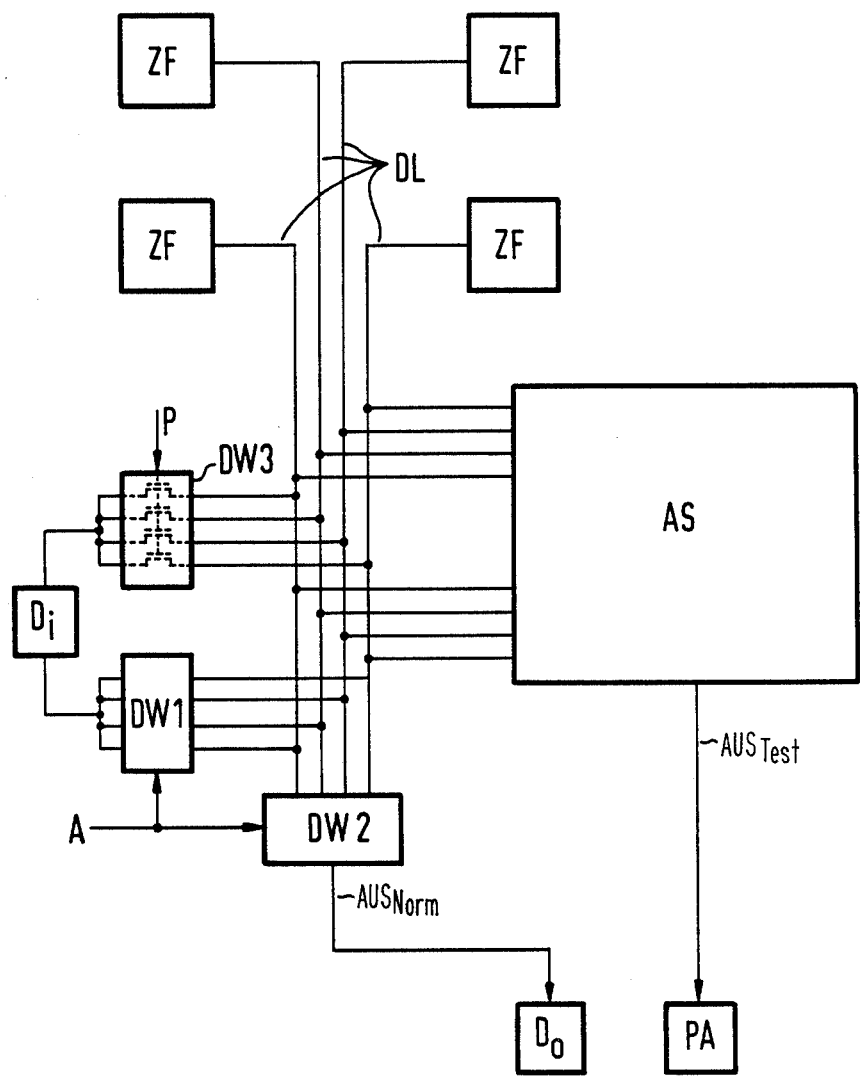
FIG. 4 is a block and schematic circuit diagram of a third embodiment of the invention.

However, it is also entirely possible in another embodiment, to directly connect the output of each of the second data separators DW2 to the corresponding data output terminal $D_o$ and to directly and separately connect the output of each evaluation circuit AS, to a terminal PA of its own, in the form of a test terminal. This embodiment is shown in FIG. 4.

Figure 5:
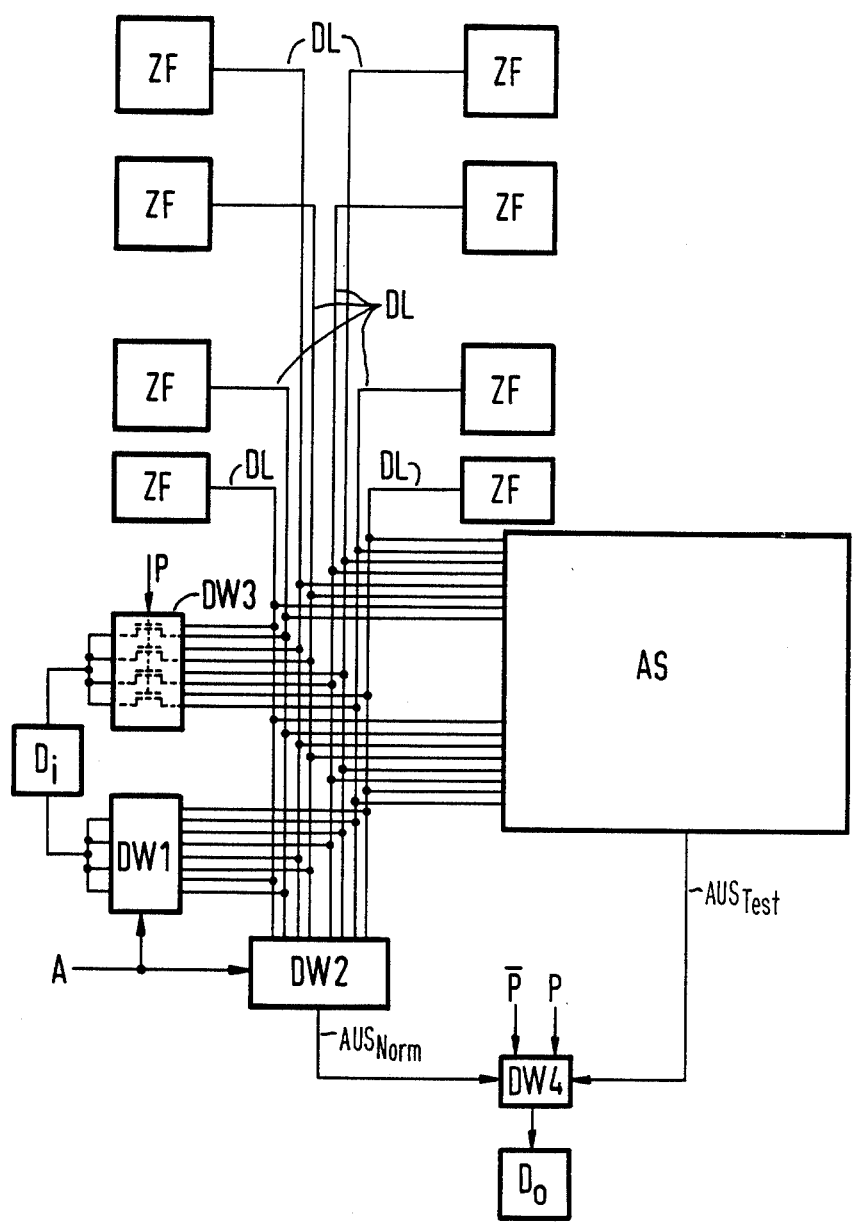
FIG. 5 is a diagram of the first embodiment of the invention, applied to a memory with eight cell fields.

FIG. 5 shows an embodiment of a semiconductor memory according to the invention, in which n=8 cell fields ZF are used instead of n=4 cell fields ZF. The operation of the semiconductor memory is the same as described for FIG. 1. However, in the testing operation, a even greater reduction of the testing time is achieved.

FIG. 6 shows an embodiment of a semiconductor memory according to the invention in which n=4 cell fields ZF are again used, but which has a width of m=2 bits at the data interfaces. The operation is the same as described with respect to FIG. 1. It should only be clarified that both illustrated first data separators DW1, second data separators DW2, third data separators DW3, fourth data separators DW4, the cell fields ZF as well as the two evaluation circuits AS, each work in parallel to each other and independently of each other. In order to illustrate the fact that the data interfaces of the m=2 bits carry information independently of each other, the designations $D_{i1}$, $D_{o1}$, $D_{i2}$, $D_{o2}$, $AUS_{Test\ 1}$, $AUS_{Test\ 2}$, Norm 1, and $AUS_{Norm\ 2}$ are chosen instead of the designations $D_i$, $D_o$, $AUS_{Test}$ and $AUS_{Norm}$.

Furthermore, different embodiments of the invention are possible, particularly regarding the construction of the evaluation circuit AS. However, all of the embodiments are within the scope of the invention, because it is not a problem for one of ordinary skill in the art to modify the logic circuits shown without deviating from the formulation of the invention or from the basic idea of the invention.

The foregoing is a description corresponding in substance to German application No. P 34 47 761.6, filed Dec. 28, 1984, the International priority of which is being claimed for the instant application, and which is hereby made part of this application. Any material discrepancies between the foregoing specification and the aforementioned corresponding German application are to be resolved in favor of the latter.

I claim:

1. Integrated semiconductor memory, comprising n identical memory cell fields each having a data width equal to m, m and n being positive integers, nm data lines, m of said nm data lines being connected with one of said memory cell fields for writing-in and reading-out memory data into and out of said memory cell fields, m first data separators each being connected to n of said nm data lines and each having an assigned data input terminal for applying the memory data present at said assigned data input terminal to be written into one of said n data lines of the semiconductor memory as a function of addressing data when written-in, m second data separators each being connected to n of said nm data lines and each having an output for selecting one of said n data lines in response to the addressing data when reading out the memory data present at said n data lines and for appplying the memory data to said outputs of said second data deparators, m data output terminals connected to said outputs of said second data separators for receiving the memory data, first terminal means for providing a control signal, second terminal means for providing a signal complementary to said control signal, evaluation circuits each having an output and each being connected to n of said nm data lines parallel to said respective second data separators for delivering output signals at said outputs of said evaluation circuits, each output signal being in the form of a first logical level if all n data lines connected to one of said evaluation circuits contain the same memory data and for delivering output signals at said outputs of said evaluation circuits in the form of a second logical level if said n data lines connected to one of said evaluation circuits contain different memory data, third data separators connected to said first terminal means and connected between each of said m data input terminals and said n of nm data lines parallel to said first data separators for transferring the memory data to be written into the semiconductor memory in parallel to all of said n data lines in response to said control signal, and m fourth data separators each being connected to said first and second terminal means and each being connected between a respective one of said m data output terminals and said outputs of a respective one of said second data separators and of a respective one of said evaluation circuits for selectively feeding the memory data selected by said second data separators and the output signal generated by said evaluation circuit to said data output terminals in response to said control signal and said complementary signal.

2. Integrated semiconductor memory according to claim 1, wherein each of said evaluation circuits includes a valence function device having inputs forming connections of said evaluation circuits to said n data lines and an output forming said outputs of said evaluation circuits.

3. Integrated semiconductor memory according to claim 1 wherein each of said evaluation circuits includes an antivalence function device having inputs forming connections of said evaluation circuits to said n data lines and an output forming said outputs of said evaluation circuits.

4. Integrated semiconductor memory according to claim 1, wherein each of said third data separators includes n transistors each being connected between an associated data input terminal and a respective one of said data lines for said data input terminal, and said transistors have gates connected in parallel to said first terminal means 5. Integrated semiconductor memory according to claim 1, wherein each of said m fourth data separators each include first and second transistors having source, drain and gate terminals, said drain terminals of said first and second transistors being connected together to an associated data output terminal, said source terminal oi said first transistor being connected to said output of an associated second data separator, said source terminal of said second transistor being connected to said output of an associated evaluation circuit, said gate terminal of said first transistor being connected to said second terminal means, and said gate terminal of said second transistor being connected to said first terminal means.

6. Integrated semiconductor memory according to claim 1, wherein said first terminal means is a separate terminal used exclusively for said control signal.

7. Integrated semiconductor memory according to claim 1, wherein said first terminal means is a terminal which is also used for other signals from the semiconductor memory.

8. Integrated semiconductor memory according to claim 7, wherein said first terminal means receives the most significant of the addressing signals during normal operation.

9. Integrated semiconductor memory according to claim 8, wherein said control signal is at a higher potential than that which corresponds to a logical "1", for switching from normal operation to testing operation in which said evaluation circuits are used.

10. Integrated semiconductor memory according to claim 9, wherein said first terminal means includes a discriminator circuit for recognizing whether or not said higher potential is applied and for activating said control signal.

11. Integrated semiconductor memory according to claim 7, wherein said control signal is at a higher potential than that which corresponds to a logical "1", for switching from normal operation to testing operation in which said evaluation circuits are used.

12. Integrated semiconductor memory according to claim 11, wherein said first terminal means includes a discriminator circuit for recognizing wheter or not said higher potential is applied and for activating said control signal.

13. Integrated semiconductor memory, comprising n identical memory cell fields each having a width equal to m, n and m being positive integers, nm data lines, m of said nm data lines being connected with one of said memory cell fields for writing-in and reading-out memory data into and out of said memory cell fields, m first data separators each being connected to n of said nm data lines and each having an assigned data input terminal for applying the memory data present at said assigned data input terminal to be written into one of said n data lines of the semiconductor memory as a function of addressing data when written-in, m second data separators each being connected to n of said nm data lines and each having an output for selecting one of said n data lines in response to the addressing data when reading out the memory data present at said n data lines and for applying the memory data to said outputs of said second data separators, data output terminals connected to said outputs of said second data separators for receiving the memory data, terminal means for providing a control signal, evaluation circuits each having an output and each being connected to n of said nm data lines parallel to said respective second data separators for delivering an output signal at said outputs of said evaluation circuits in the form of a first logical level if all n data lines connected to said evaluation circuits contain the same memory data and for delivering an output signal at said outputs of said evaluation circuits in the form of a second logical level if said n data lines connected to said evaluation circuits contain different memory data, third data separators connected to said terminal means and connected between each of said m data input terminals and said n of nm data lines parallel to said first data separators for transferring the memory data to be written into the semiconductor memory in parallel to all of said n data lines in dependence on said control siganl, and other terminals each being connected to a respective one of said outputs of said evaluation circuits and being used exclusively therefor.

* * * * *